United States Patent
Horikoshi et al.

(10) Patent No.: US 6,861,299 B2
(45) Date of Patent: Mar. 1, 2005

(54) PROCESS FOR MANUFACTURING THIN FILM TRANSISTOR ON UNANNEALED GLASS SUBSTRATE

(75) Inventors: Kazuhiko Horikoshi, Yokohama (JP); Klyoshi Ogata, Kawasaki (JP); Takuo Tamura, Yokohama (JP); Miwako Nakahara, Yokohama (JP); Makoto Ohkura, Futyu (JP); Ryoji Oritsuki, Shirako (JP); Yasushi Nakano, Mobara (JP); Takeo Shiba, Kodaira (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/404,060

(22) Filed: Apr. 2, 2003

(65) Prior Publication Data

US 2003/0189205 A1 Oct. 9, 2003

Related U.S. Application Data

(62) Division of application No. 10/050,154, filed on Jan. 18, 2002, now Pat. No. 6,570,184.

(30) Foreign Application Priority Data

Aug. 28, 2001 (JP) ........................................ 2001-257127

(51) Int. Cl.[7] ........................... H01L 21/00; H01L 21/84
(52) U.S. Cl. ........................ 438/149; 438/151; 438/166
(58) Field of Search ........................ 438/48, 128, 149, 438/150, 151, 157, 166, 197, 198; 257/59, 66, 72

(56) References Cited

U.S. PATENT DOCUMENTS

| | | | |
|---|---|---|---|
| 5,705,829 A | | 1/1998 | Miyanaga et al. |
| 6,165,876 A | * | 12/2000 | Yamazaki et al. .......... 438/517 |
| 6,228,751 B1 | * | 5/2001 | Yamazaki et al. .......... 438/585 |
| 6,335,540 B1 | | 1/2002 | Zhang |
| 6,348,367 B1 | | 2/2002 | Ohtani et al. |
| 6,506,636 B2 | * | 1/2003 | Yamazaki et al. .......... 438/149 |
| 6,706,572 B1 | * | 3/2004 | Yamazaki et al. .......... 438/166 |

FOREIGN PATENT DOCUMENTS

| | | |
|---|---|---|
| JP | 07066426 | 3/1995 |
| JP | 8-195494 | 7/1996 |
| JP | 09080483 | 3/1997 |
| JP | 10-261801 | 9/1998 |
| JP | 2000138379 | 5/2000 |
| JP | 2000-164885 | 6/2000 |

* cited by examiner

Primary Examiner—Hoai Pham
(74) Attorney, Agent, or Firm—Antonelli, Terry, Stout & Kraus, LLP

(57) ABSTRACT

Inexpensive, unannealed glass is used as a substrate. The surface of a polycrystalline silicon film doped with boron (B) or phosphorus (P) is oxidized with ozone at a processing temperature of 500° C. or below to form a silicon oxide film of 4 to 20 nm thick on the surface of polycrystalline silicon. On account of this treatment, the level density at the interface between the gate-insulating layer and the channel layer can be made lower, and a thin-film transistor having less variations of characteristics can be formed on the unannealed glass substrate.

26 Claims, 4 Drawing Sheets

PROCESS FOR MANUFACTURING THIN FILM TRANSISTOR ON UNANNEALED GLASS SUBSTRATE

This application is a Divisional application of application Ser. No. 10/050,154, filed Jan. 18, 2002, now U.S. Pat. No. 6,570,184, the contents of which are incorporated herein by reference in their entirety.

BACKGROUND OF THE INVENTION

1. Field of the Invention

This invention relates to a thin-film transistor used in liquid-crystal display devices and a process of manufacturing the thin-film transistor.

2. Description of the Related Art

In recent years, in liquid-crystal display used as display devices such as notebook personal computers, mobile appliances and so forth, their drive systems are being changed over from simple matrix systems to active matrix systems. In particular, thin-film transistor (hereinafter often "TFT") active matrix systems are becoming prevailing in which a large number of thin-film transistors have been formed on a glass substrate.

Among TFT drive systems, TFTs making use of polycrystalline silicon layers have a larger electron mobility than those making use of amorphous silicon layers. Hence, they can be fabricated on glass substrates not only as transistors of displaying pixel areas but also as driving transistors.

Conventionally, since the formation of polycrystalline silicon requires a high temperature of about 1,000° C., it has been indispensable to use expensive quartz glass substrates as substrates. Recently, development has been brought forward on techniques by which polycrystalline silicon can be formed at a processing temperature of about 600° C., and it has become possible to use glass materials other than quartz substrates. In this method, amorphous silicon film formed on a glass substrate is subjected to laser irradiation or the like, whereby only the amorphous silicon film can be heated and crystallized without causing a rise in substrate temperature.

Meanwhile, in integrated circuit devices making use of single-crystal silicon substrates, thermal oxides (layer thickness: about a few nm to tens of nm) of silicon are used as gate-insulating layers. However, the formation of such thermal oxide films of silicon requires heat treatment at about 1,000° C., and this processing can not be utilized in the process of manufacturing polycrystalline silicon TFTs which prerequisites the processing temperature of 600° C. or below.

In processes of manufacturing TFTs, TEOS (tetraethoxysilane) is used as a material, and $SiO_2$ layer (layer thickness: about 100 nm) formed by plasma-assisted CVD (chemical vapor deposition) is used as gate-insulating layer. The $SiO_2$ layer formed by plasma-assisted CVD (hereinafter "TEOS layer"), however, has so high an interfacial state density that a great performance deterioration of TFT characteristics may be bought about as is seen in, e.g., variations of threshold voltage when it is used as the gate-insulating layer as it is. Moreover, in such a case, the breakdown strength of TFT may severely deteriorate with time to cause dielectric breakdown of the TFT as a result thereof. Accordingly, at the interface of the gate-insulating layer for TFT and the silicon layer, it is desirable to form an oxide layer having low interfacial state density, comparable to thermal oxides formed by thermal oxidation of silicon.

To cope with the above problem, e.g., Japanese Patent Application Laid-open No. 8-195494 discloses a method of manufacturing a polycrystalline silicon TFT at a processing temperature of 600° C. or below, using a conventional highly heat-resistant glass substrate.

According to the above method disclosed in Japanese Patent Application Laid-open No. 8-195494, since the polycrystalline silicon layer is formed at a temperature of about 600° C., a usable glass substrate is limited to what is called an annealed glass, which has previously been heat-treated. Hence, where an unannealed glass substrate is used in place of the annealed glass substrate, the temperature condition of about 600° C. may cause a shrinkage of the glass substrate, and this may cause a warpage or strain of the glass substrate to bring about difficulties such as break of the glass substrate itself and peel of the layer in-the worst.

In general, the higher strain point the glass has, the higher thermal stability it has. Such glass, however, is difficult to melt, mold and work in the step of producing the glass substrate, resulting in a high production cost. Accordingly, in order to control the cost, a production method is essential which enables use of glass which has a low strain point and is inexpensive.

Usually, alkali-free glass substrates used as substrates of thin-film transistors have a strain point of about 600° C., and compaction (heat shrinkage) of glass becomes great abruptly as a result of heat history at a temperature a little lower than the strain point. For example, an unannealed glass substrate CORNING 7059F (trade name; available from Corning Incorporated; strain point: 593° C.) shows a compaction of about 800 ppm as a result of heat history at 600° C., for 1 hour and at a cooling rate of 1° C./minute. Also, in the case of CORNING 1735F (strain point: 665° C.), having a higher strain point, it shows a compaction of 173 ppm upon application of the same heat history as the above, Then, it has been made possible to lower compaction due to the like heat history to about 10 ppm by carrying out annealing previously at 660° C./1 hr.

Substrates for polycrystalline TFT panels are usually required to show a heat shrinkage rate (compaction) of 20 ppm or less. Accordingly, it has ever been considered indispensable to use annealed glass substrate, Thus, where the upper limit of processing temperature is merely lowered to the temperature of such a degree that the shrinkage of unannealed glass substrates is negligible, e.g., to 450 to 500° C., a problem discussed below may occur.

That is, as a gate-insulating layer formed on a polycrystalline silicon layer, the $SiO_2$ layer is commonly formed in a layer thickness of about 100 nm by plasma-assisted CVD (chemical vapor deposition) using TEOS as raw material gas, At the interface between the polycrystalline silicon layer and the insulating layer formed of TEOS, however, the TEOS layer has so high an interfacial state density that the threshold voltage required as TFT tends to vary and also the breakdown strength required as the gate-insulating layer may severely deteriorate with time. Thus, there is a great problem on the reliability of TFT.

SUMMARY OF THE INVENTION

Hence, in the case when the use of an unannealed glass substrate is premised, it is important to design to keep the upper limit of processing temperature at about 450 to 500° C. and lower the interfacial state density between the polycrystalline silicon layer and the gate-insulating layer to a level corresponding to that of any silicon oxide layer formed by thermal oxidation.

To solve the problem discussed above, an object of the present invention is to form a highly reliable polycrystalline-silicon thin-film transistor at processing temperature that may cause no problem on the compaction even when unannealed glass substrates are used.

Here, in the present invention, a glass substrate showing a compaction of 30 ppm or higher when the glass substrate is heated at 600° C. for 1 hour and thereafter cooled at a rate of 1° C./minute is defined as the unannealed glass substrate.

To achieve the above object, in the present invention, i) a polysilicon crystal layer for forming a channel region, a source region and a drain region, ii) a first insulating layer and iii) a second insulating layer are formed at the upper part of an unannealed glass substrate. Also, a gate region is formed at a position corresponding to the channel region and on the second insulating layer, and a gate electrode, a source electrode and a drain electrode are also formed to make electrical interconnection with the gate region, the source region and the drain region, respectively.

Here, the first insulating layer is a silicon oxide layer formed by oxidizing the surface of a polycrystalline silicon layer doped with an element belonging to Group IIIb [e.g., boron (B)] or an element belonging to Group Vb [e.g., phosphorus (P)] of the periodic table, at its channel region at a temperature of 500° C. or below, and is so formed as to cover the surface of at least the channel region and to be in a layer thickness of from 4 nm to 20 nm.

In the present invention, the first insulating layer silicon oxide layer is also formed by oxidizing the surface of the polycrystalline silicon layer in an atmosphere containing at least ozone.

In the present invention, the second insulating layer provided at the upper part of the first insulating layer is formed by chemical vapor deposition, physical vapor deposition or spin coating.

Since as described above the surface of the polycrystalline silicon layer doped with an element belonging to Group IIIb or an element belonging to Group Vb of the periodic table is oxidized in an ozone atmosphere, a silicon oxide layer having a larger thickness than ever can be formed, at a high rate. Also, since the surface of the polycrystalline silicon layer is oxidized, the interface between the polycrystalline silicon layer and the silicon oxide layer can be kept in a good state. Moreover, since the silicon oxide layer can be formed at a processing temperature lower than ever, a relatively inexpensive, unannealed glass substrate, which are relatively inexpensive, can be used as the substrate, In other words, the thin-film transistor manufactured by the above method has a good interface between the surface of the channel region comprised of polycrystalline silicon and the gate-insulating layer formed thereon, and hence the thin-film transistor characteristics concerned closely with the interfacial state density thereat, as exemplified by threshold voltage, can be made to less vary so that superior TFT characteristics can be exhibited. In addition, since the unannealed glass substrate can be used as the substrate, the TFT can be formed in a large area and yet at a low cost, compared with quartz glass substrates or the like.

Here, as a known product having a structure similar to the TFT of the present invention, Japanese Patent Application Laid-open No. 2000-164885 discloses an insulated-gate type semiconductor device, and a manufacturing process therefor, in which a gate-insulating layer containing phosphorus or boron is formed by sputtering in order to prevent Na ions from diffusing from a glass substrate. In the construction disclosed in this publication, however, a deposition process (sputtering) is used as a method of forming the gate-insulating layer, and hence hot carriers tend to be injected through the interface between the gate-insulating layer and the semiconductor to cause a deterioration with time.

Japanese Patent Application Laid-open No. 10-261801 also discloses a thin-film transistor device in which the gate-insulating layer comprises a silicon oxide layer containing phosphorus or boron in order to prevent Na ions from diffusing from a glass substrate. However, the gate-insulating layer disclosed in this publication is formed by a deposition process (CVD), and hence the deterioration due to hot carriers injected through the interface between the gate-insulating layer and the semiconductor comes into question like the case of the foregoing Japanese Patent Application Laid-open No. 2000-164885.

In the present invention, the insulating layer formed on the channel region comprised of polycrystalline silicon is formed by a method different form the above deposition process, i.e., the $SiO_2$ layer is formed by oxidizing the surface of a polysilicon film. Hence, a thin-film transistor can be formed which has less levels ascribable to impurities at the $SiO_2$/p-Si interface and may cause less deterioration with time.

BRIEF DESCRIPTION OF THE DRAWINGS

These and other features, objects and advantages of the present invention will become more apparent from the following description when taken in conjunction with the accompanying drawings wherein.

DESCRIPTION OF THE PREFERRED EMBODIMENTS

Embodiments of the present invention are described below in detail with reference to the accompanying drawings.

Figure 1:
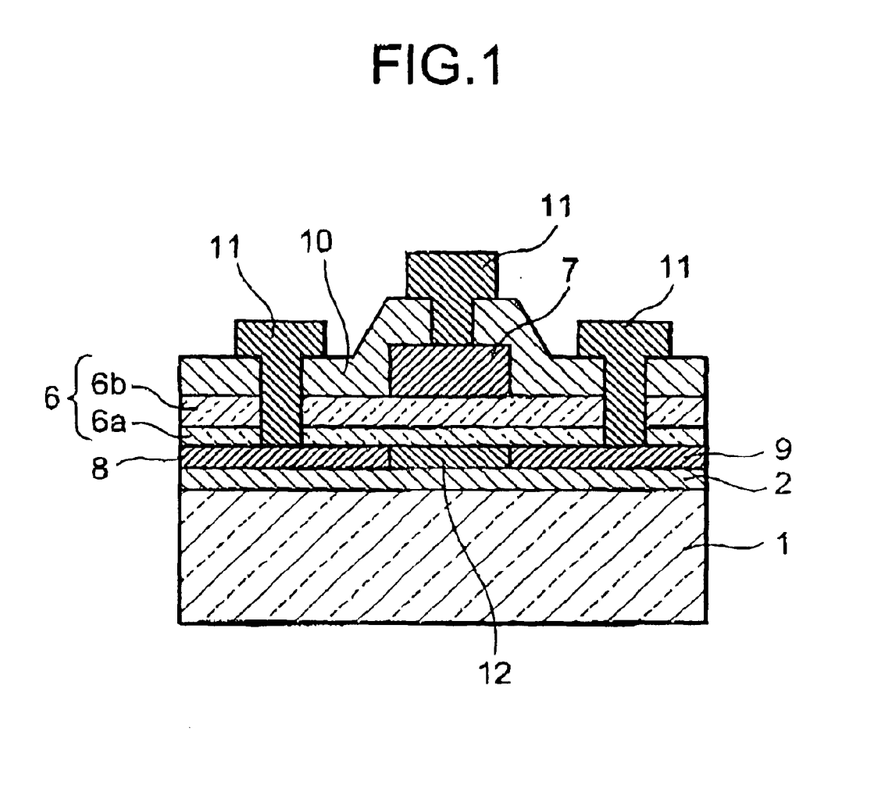
FIG. 1 is a schematic sectional view for describing a thin-film transistor according to a first embodiment.

FIG. 1 is a structural view showing a main-part cross section of a thin-film transistor according to a first embodiment. A source region 8, a drain region 9 and a channel region 12 which are comprised of a polycrystalline silicon layer are formed on a diffusion preventive layer 2 formed on an unannealed glass substrate 1. Then, a gate-insulating layer 6 consisting of an $SiO_2$ layer 6a formed by oxidizing the polycrystalline silicon layer doped with an element belonging to Group IIIb or an element belonging to Group Vb of the periodic table (for example, boron (B) of Group IIIb or phosphorus (P) of Group Vb) and an insulating layer 6b formed by a deposition process is provided on the channel region 12.

On the top of the gate-insulating layer 6, a gate region 7 is formed at a position corresponding to the channel region 12, and an interlaminar insulating layer 10 is so formed as to cover a part of the surface of this gate region 7. Then, the source region 8, drain region 9 and gate region 7 are electrically interconnected with their corresponding electrodes 11 through openings provided in this interlaminar insulating layer 10.

A process of producing the above structure shown in FIG. 1 is described below with reference to a flow sheet shown in FIG. 2.

Figure 2A:
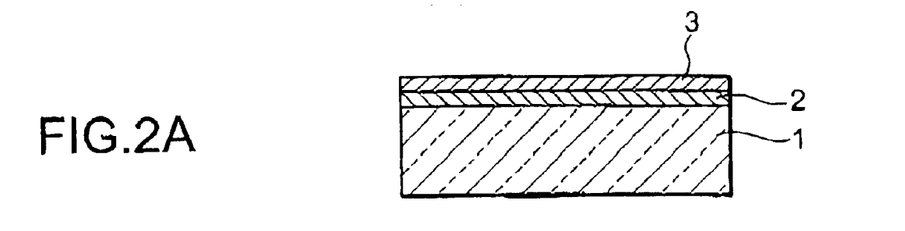
FIGS. 2A to 2E show a flow sheet for describing a process of manufacturing the thin-film transistor according to a first embodiment.

First, on an unannealed glass substrate 1, a diffusion preventive layer 2 (layer thickness: 50 to 200 nm) comprised of an SiN film or $SiO_2$ film is formed by conventional plasma-assisted CVD (chemical vapor deposition). It is formed so that any impurities as exemplified by sodium ions contained in the unannealed glass substrate can be prevented from diffusing into the thin-film transistor formed on the substrate as described later. Thereafter, an amorphous silicon film 3 (layer thickness: 50 nm) is subsequently formed by plasma-assisted CVD using monosilane or disilane as a material and under conditions of treatment temperature of from 300 to 500° C. (FIG. 2A).

Figure 2B:
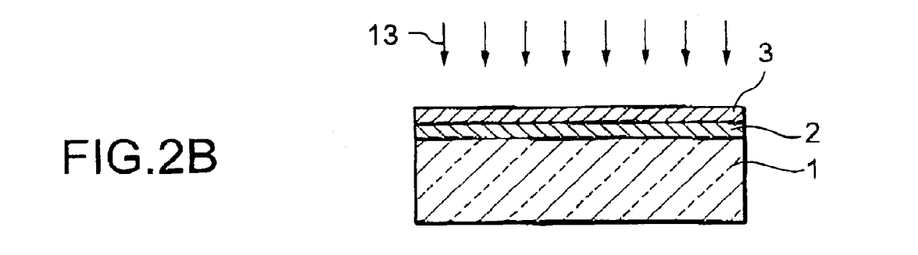

Next, the Group IIIb element boron (B) ions 13 are ion-implanted to the surface of the amorphous silicon film 3 under conditions of an accelerating voltage of from 0.5 to 100 keV and a dose of from 1E10 to $1E16/cm^2$ (FIG. 2B). As a result of this ion implantation, boron stands implanted into the polycrystalline silicon layer at least at its part just beneath the gate which serves as the channel later. The boron (B) is also partly implanted into the diffusion preventive layer 2, and hence the effect of preventing sodium ions and so forth from diffusing from the glass substrate into the device can be improved. The accelerating voltage and dose at the time of ion implantation of boron may be selected within the range in which the effect of accelerating oxidation can be obtained without lowering TFT characteristics.

Here, the boron having been implanted forms density distribution in the depth direction from the surface of the amorphous silicon film 3. Hence, the peak density of boron may preferably be positioned in a depth of from 1 to 20 nm from the surface. Also this peak density may preferably be from about 1E18 to $1E21/cm^3$. The reason therefor is that it is a value suited for obtaining the effect of accelerating the rate of oxidation when the silicon surface is oxidized in the later step.

Figure 2C:
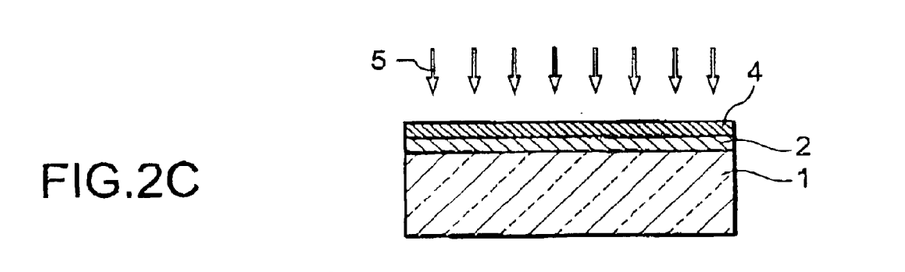

Thereafter, the surface of the amorphous silicon film 3 is irradiated by excimer laser light 5 to crystallize part or the whole of the amorphous silicon film 3 to form a polycrystalline silicon layer 4 (FIG. 2C). The excimer laser light 5 is irradiated under conditions of, e.g., from 300 to 600 $mJ/cm^2$, and irradiation made 10 to 20 times by pulse light. Here, the excimer laser light 5 is absorbed in the amorphous silicon film 3, which is then heated and crystallized, and hence the whole unannealed glass substrate 1 is by no means heated to 500° C. or above as a result of the irradiation by this excimer laser light 5. In FIG. 2C, the step is illustrated as if the whole surface of the glass substrate 1 is irradiated by laser light. In practice, however, it is so irradiated that excimer laser light 5 concentrated in rectangular area is scanned.

Figure 2D:
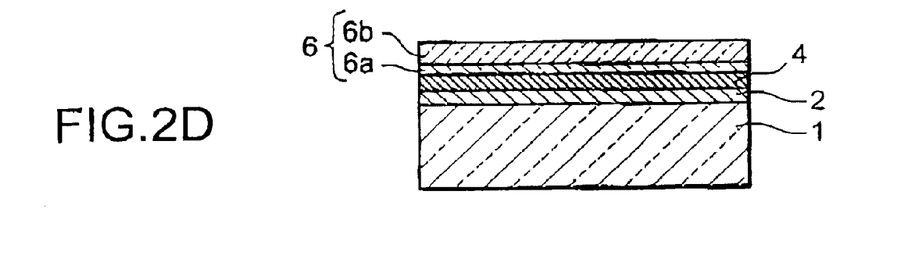

Next, to the polycrystalline silicon layer 4 doped with boron (B), from 50 to 100 $g/m^3$ (about 2 to 5%) of ozone gas is fed at a rate of from 0.1 to 1 $SLM/cm^2$ at a temperature of from 450 to 500° C. under atmospheric pressure, to oxidize its surface to form silicon oxide layer 6a (a first insulating layer). Here, the first insulating layer must be in a layer thickness of at least 4 nm as will be detailed later. Then, a silicon oxide layer 6b (second insulating layer) of from about 50 to 100 nm in thickness is formed by a deposition process such as CVD to form a gate-insulating layer 6 of from about 50 to 100 nm in total layer thickness (FIG. 2D).

Figure 2E:
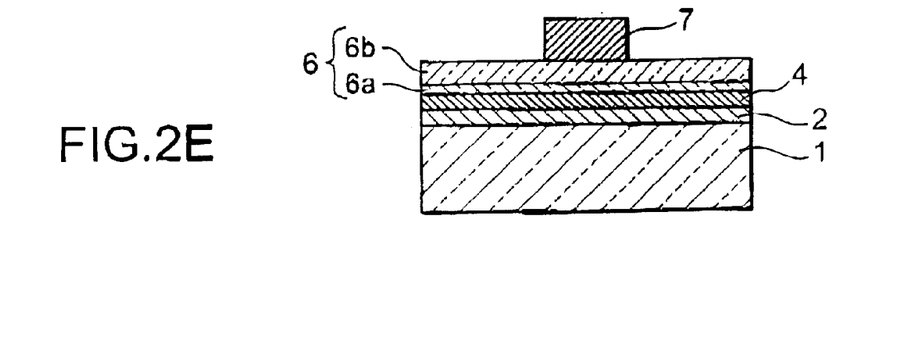

Then, a gate region 7 is formed on the gate-insulating layer 6 by a conventionally known method, and is worked into a desired shape (FIG. 2E). As a material for the gate region, a conductive material such as an impurity-doped silicon film, a metal or a metal compound (such as TiN or TiW) may be used.

Next, the gate region 7 thus worked being used as a mask, Group Vb element phosphorus (P) ions are implanted into the polycrystalline silicon layer 4 to form a source region 8 and a drain region 9. The phosphorus ions are implanted into the polycrystalline silicon layer 4 under conditions of an accelerating voltage of from 1 to 100 keV and a dose of from 1E10 to $1E16/cm^2$. Thereafter, in order to activate the phosphorus ions thus implanted, RTA (rapid thermal annealing) treatment is made, which is carried out under conditions of from 1 to 50 $kW/cm^2$ and for 1 to 5 s. Incidentally, in this RTA treatment, too, only the polycrystalline silicon layer 4 is heated and hence the whole underlying unannealed glass substrate is by no means heated to 550° C. or higher.

Next, on the gate-insulating layer 6, an interlaminar insulating layer 10 comprised of $SiO_2$ formed by plasma-assisted CVD at a treatment temperature of from 300 to 500° C. using TEOS as a material is so formed as to cover the surface of the gate region 7 shown in FIG. 2E. Then, openings for making electrical interconnection with the gate region 7, source region 8 and drain region 9 are formed at prescribed positions of the interlaminar insulating layer 10. Through the openings, corresponding electrodes 11 connected with the gate region 7, source region 8 and drain region 9 are formed. Thus, the thin-film transistor shown in FIG. 1 is completed.

Figure 3:
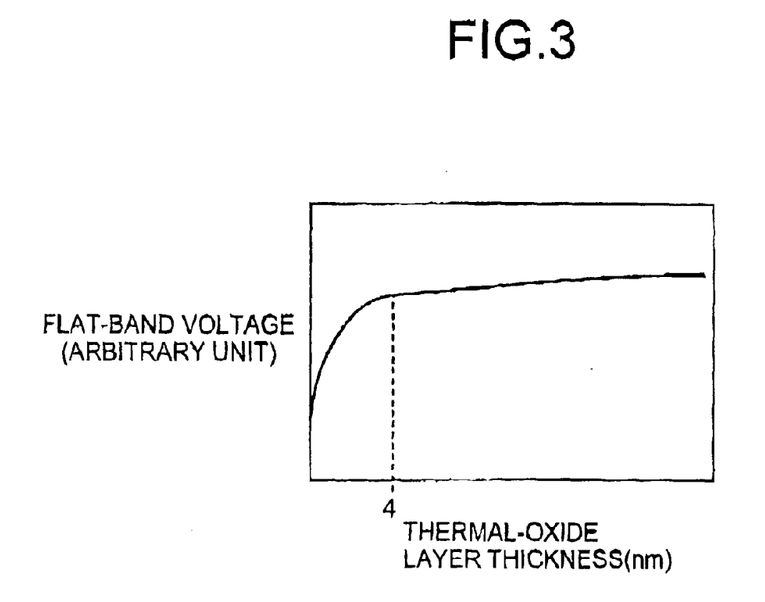
FIG. 3 illustrates the relationship between thermal-oxide layer thickness and flat-band voltage.

Now, the layer thickness of the first insulating layer shown in FIG. 2D is described. FIG. 3 shows the relationship between layer thickness of a thermal oxide (first insulating layer) and flat-band voltage in an MOS (metal oxide semiconductor) transistor having a double-layer gate-insulating layer structure of thermal oxide/TEOS. As can be seen from FIG. 3, the flat-band voltage in the MOS transistor lowers when the thermal oxide is smaller than 4 nm in layer thickness. This phenomenon occurs because the interfacial state density at the interface between the thermal oxide and the underlying layer silicon layer is so high that electrons are captured in this interfacial level to make it impossible for the transistor to exhibit its desired transistor characteristics. On the other hand, the flat-band voltage is kept at substantially a constant value as long as the layer thickness of the thermal oxide is 4 nm or larger, making it possible to ensure the desired transistor characteristics.

Incidentally, it is unnecessary to dare to define the upper limit of the thermal-oxide layer thickness, but it is unnecessary to make its thickness large too much when the gate insulating layer is formed in the thermal oxide/TEOS double-layer structure, More specifically, taking account of the productivity of thin-film transistors, it is suitable for the layer thickness to be, e.g., about 20 nm as its upper limit, considering that the process of thermal oxidation is a process in which the oxide layer is formed at a low rate.

Figure 4:
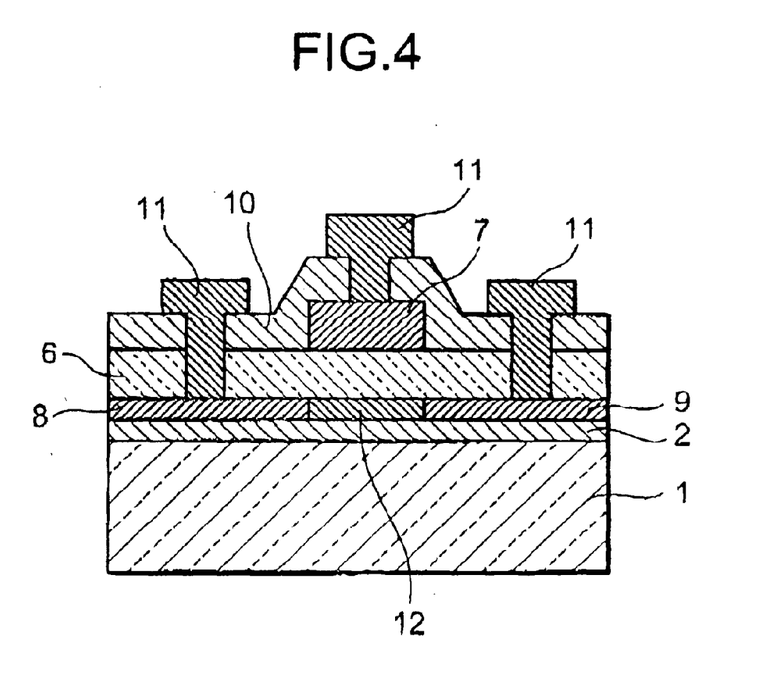
FIG. 4 is a schematic sectional view for describing a thin-film transistor according to a second embodiment.

A second embodiment is described below with reference to FIG. 4. The process is the same as that in the first embodiment up to the step of crystallizing the boron(B)-implanted amorphous silicon film 3 by irradiation with excimer laser light 5 (FIG. 2C).

Next, the surface of the polycrystalline silicon layer 4 doped with boron (B) is oxidized to form a silicon oxide layer of 4 nm or larger in thickness. Then, this silicon oxide layer is made to function as the gate-insulating layer 6. The steps subsequent to the step of forming the gate region 7 thereafter are the same as those shown in the first embodiment. Through these steps, a thin-film transistor is completed in which the gate-insulating layer 6 has a single-layer structure as shown in FIG. 4.

According to a second embodiment, since the gate-insulating layer 6 has the single-layer structure and the layer has a thickness of about 20 nm, it is possible to activate the thin-film transistor safely compared with the first embodiment.

A third embodiment is described below with reference to FIGS. 5A to 5E.

Figure 5A:
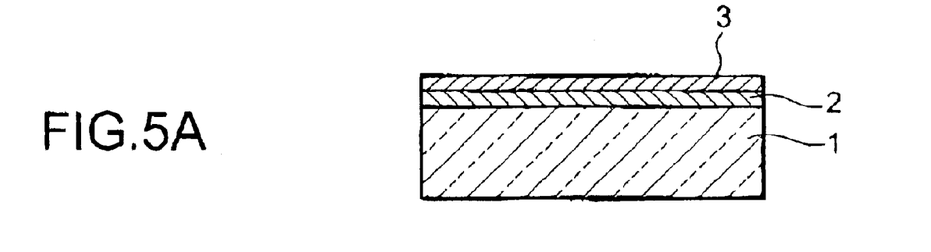
FIGS. 5A to 5E show a flow sheet for describing a process of manufacturing the thin-film transistor according to a third embodiment.

FIGS. 5A to 5E show a flow sheet for the formation of a thin-film transistor. The process is the same as that in the first embodiment up to the step of forming an amorphous silicon film 3 on a diffusion preventive layer formed on a glass substrate 1. (FIG. 5A).

Figure 5B:
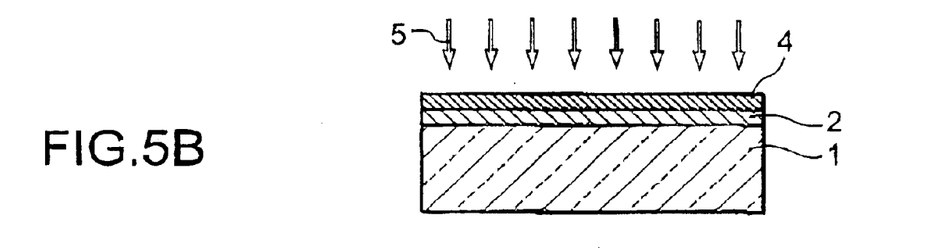
Figure 5C:
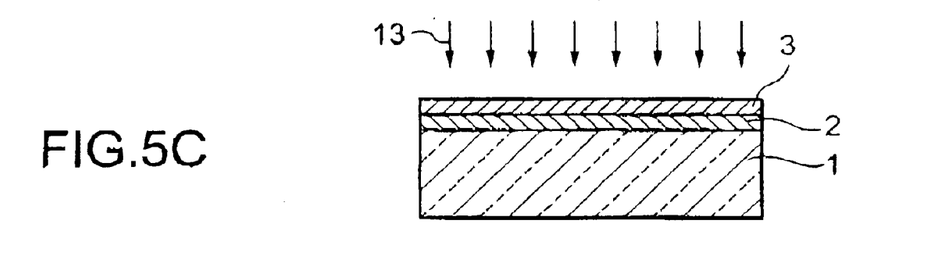

Next, the surface of the amorphous silicon film 3 is irradiated by excimer laser light 5 to effect crystallization to form a polycrystalline silicon layer 4 (FIG. Vb). Thereafter, to the polycrystalline silicon layer 4, the Group IIIb element boron (B) ions 13 are implanted under conditions of an accelerating voltage of from 0.5 to 100 keV and a dose of from 1E10 to 1E16/cm$^2$ (FIG. 5C). As a result of this ion implantation, boron stands implanted into the polycrystalline silicon layer at least at its part just beneath the gate which serves as the channel later. The boron (B) is also partly implanted into the diffusion preventive layer 2, and hence the effect of preventing sodium ions and so forth from diffusing from the glass substrate into the device can be improved.

Figure 5D:
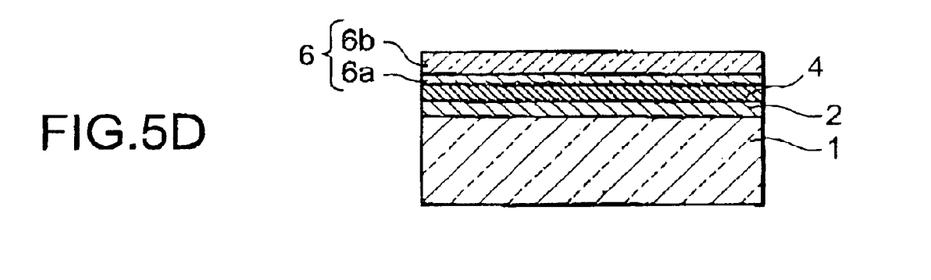
Figure 5E:
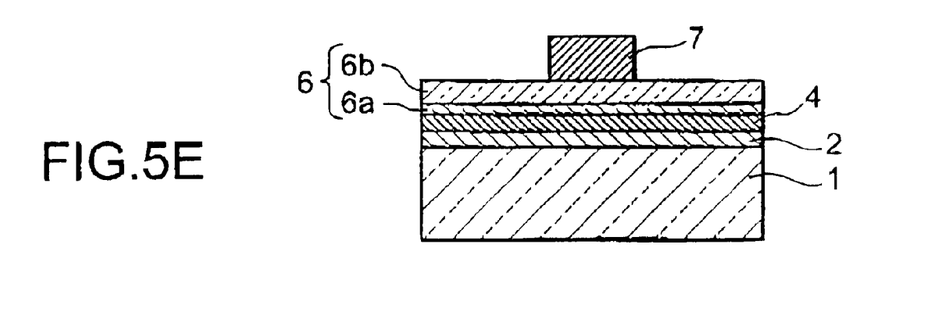

Next, on the boron (B)-implanted polycrystalline silicon layer 4, a first insulating layer 6a and a second insulating layer are formed (FIG. 5D). Here, although in the previous first embodiment the crystallization by excimer laser light 5 is effected after the boron (B) has been implanted to the second insulating layer, the order of the step of crystallization by excimer laser light 5 and the step of implantation of boron (B) may be reversed as in the present embodiment. Even in such a case, the rate of formation of the oxide layer (first insulating layer 6a) formed on the polycrystalline silicon layer 4 does not lower.

Next, on the gate-insulating layer 6, a gate region 7 is formed at a position corresponding to the channel region 12 (FIG. 5E), and an interlaminar insulating layer 10 and an electrode 11 are formed. Thus, a thin-film transistor like the case shown in FIG. 1 is completed.

In the above embodiments, the second insulating layer silicon oxide layer is formed by CVD like that in the first embodiment. The like effect is obtainable also when it is formed by physical deposition such as sputtering or by spin coating.

Now, in the above first and third embodiments, what is constructed is an N-channel MOS type thin-film transistor. A P-channel MOS type thin-film transistor can also be formed by appropriately selecting the type of ions implanted into the source region 8 and drain region 9. Also, using such ion implantation properly, C-MOS type thin-film transistor can also be formed in which the N-channel MOS type and P-channel MOS type are fabricated on the same substrate.

A method of forming the silicon oxide layer 6a, obtained by oxidizing the surface of the polycrystalline silicon layer 4, is described below in detail.

A sample comprising the unannealed glass substrate 1 on which the polycrystalline silicon layer 4 has been formed is carried into a first processing chamber, and is heated to, e.g., about 450° C., which is a temperature of such a degree that does not adversely affect the unannealed glass substrate 1. Meanwhile, 100 g/Nm$^3$ ozone (about 1 SLM/cm$^2$: the value obtained when the total flow rate of ozone is divided by the effective processing area) is introduced into a second processing chamber set adjacent to, but isolated from, the first processing chamber, and the inside of the second processing chamber is controlled to about 700 Torr. With regard to the ozone, 100 g/Nm$^3$ of ozone (ozone concentration: about 5%) is produced by means of a well known silent-discharge ozonizer, using as a material a mixed gas of pure oxygen gas (10 SLM) and a trace amount of N$_2$ gas (55 SCCM).

The sample heated to 450° C. is carried from the first processing chamber into the second processing chamber kept in the above oxidizing atmosphere. By the processing thus carried out, the surface of the polycrystalline silicon layer 4 is oxidized. The processing time in the second processing chamber may be set to be, e.g., 10 minutes, thus the first insulating layer 6a, i.e., the SiO$_2$ layer, having a layer thickness of about 4 nm is formed at the surface of the polycrystalline silicon layer 4. Here, since the boron (B) ions have been implanted into the polycrystalline silicon layer 4, the rate of oxidation can be greater than the case in which any boron (B) ions are not implanted (the conventional method), and consequently an SiO$_2$ layer having a large layer thickness can be formed.

Mechanism of the oxidation of the silicon layer is briefly described below.

Upon exposure of the silicon surface to an atmosphere of the oxidizing species, this oxidizing species first becomes adsorbed on the silicon surface, and the oxidation is started. Also, in the case when silicon has the silicon oxide layer at its surface, the oxiding species having become adsorbed on the surface of the silicon oxide layer diffuses into the silicon oxide layer. Then, with progress of the diffusion, the oxidizing species reaches the interface between the silicon oxide layer and the silicon, whereupon the reaction of the silicon with the oxidizing species takes place at that interface, so that the silicon oxide layer grows.

Conventionally, the oxidation of silicon has required processing at a high temperature of 800° C. or above. The use of ozone gas, however, enables formation of the oxide film at a lower temperature. When the polycrystalline silicon is further doped with the impurities such as boron (B) and phosphorus (P), the rate of oxide film formation can be greater than the case in which it is not doped with such impurities.

The reason therefor can be explained by the following mechanism.

The mechanism of oxidation in the case when the polycrystalline silicon layer stands doped with phosphorus (P) can be modeled by linear-parabolic approximation widely used in the field of single-crystal silicon. More specifically, between the oxide layer thickness d and the time t, the relation of $d^2 + A \cdot d = B/(t+\tau)$ is given. Here, $\tau$, A and B are constants.

In the oxidation of silicon doped with phosphorus, the phosphorus segregates on the silicon side and enhances in the silicon region the density of voids which serve as the reaction site of oxidizing species with silicon, so that the rate of oxidation increases. In other words, the segregation of phosphorus on the silicon side makes higher the rate of reaction at the interface between Si/SiO$_2$, and the linear constant B/A is most remarkably influenced to become large. Moreover, since in the polycrystalline silicon the phosphorus segregates at grain boundaries, the rate of oxide film formation more increases through the grain boundaries.

On the other hand, in the case when the polycrystalline silicon is doped therein with boron (B), the boron segregates on the $SiO_2$ side to weaken the bond structure of $SiO_2$. Hence, in the oxide film having the structure thus weakened, the diffusion of oxidizing species is accelerated, and consequently the rate of oxidation increases. Namely, it follows that the value of the constant B in the above relation increases in the case of the silicon layer doped with boron ions.

The second insulating layer 6b to be formed on the first insulating layer 6a ($SiO_2$ layer) formed by oxidizing the surface of the polycrystalline silicon layer 4 may be formed by, e.g., CVD, PVD (physical vapor deposition) or spin coating. In the case of CVD, usable are a method which utilizes thermal decomposition carried out using TEOS as a material gas, and a method which utilizes thermal decomposition carried out using monosilane or disilane as a material gas. In the case of PVD, sputtering or vacuum vapor deposition may be used. For example, RP (radio frequency) sputtering may be carried out in an $Ar/O_2$ mixed gas, using an $SiO_2$ target, whereby a dense $SiO_2$ film can be obtained, Also, in the case of spin coating, SOG (spin-on-glass) coating may be used.

The gate insulating layer 6 is completed by the process described above,

The TFT formed on the unannealed glass substrate at a low temperature of 500° C. or below by the process described above has the gate-insulating film of 4 nm or more thick on the polycrystalline silicon layer channel region, and the $SiO_2$ film formed by oxidizing the polycrystalline silicon layer is used as its insulating layer. Thus, its interfacial state density can be lowered, and, as the result, the threshold voltage Vth which is one of important characteristics of the TFT can be kept less change with time, as having been so confirmed.

As described above, the employment of surface treatment of the polycrystalline silicon layer by utilizing ozone oxidation enables formation of a thin-film transistor for liquid-crystal display on the inexpensive, unannealed glass substrate.

While we have shown and described several embodiments in accordance with our invention, it should be understood that disclosed embodiments are susceptible of changes and modifications without departing from the scope of the invention. Therefore, we do not intend to be bound by the details shown and described herein but intend to cover all such changes and modifications as fall within the ambit of the appended claims.

What is claimed is:

1. A process of manufacturing a thin-film transistor, comprising steps of:
   (1) forming an amorphous silicon layer at the upper part of an unannealed glass substrate;
   (2) implanting an element belonging to Group IIIb or an element belonging to Group Vb, into the amorphous silicon layer;
   (3) irradiating the amorphous silicon layer by laser light to form a polycrystalline silicon layer;
   (4) forming an insulating layer on the polycrystalline silicon layer at a temperature of 500° C. or below;
   (5) forming a gate region on the insulating layer; and
   (6) implanting an element belonging to Group Vb or an element belonging to Group IIb, into a source region and a drain region by ion implantation, using the gate region as a mask.

2. The process of manufacturing a thin-film transistor according to claim 1, wherein the step of forming said insulating layer comprises oxidizing the surface of said polycrystalline silicon layer in an atmosphere containing at least ozone.

3. The process of manufacturing a thin-film transistor according to claim 1, wherein said element belonging to Group IIIb is boron and said element belonging to Group Vb is phosphorus.

4. The process of manufacturing a thin-film transistor according to claim 1, wherein in step (2) an element from Group IIIb is implanted and in step (7) an element from Group Vb is implanted.

5. The process of manufacturing a thin-film transistor according to claim 1, wherein in step (2) an element from Group Vb is implanted, and in step (7) an element from Group IIIb is implanted.

6. The process of manufacturing a thin-film transistor according to claim 1, wherein the step of forming the insulating layer comprises oxidizing the surface of said polycrystalline silicon layer in an atmosphere containing at least ozone to form a first insulating layer, and depositing a second insulating layer on the first insulating layer.

7. The process of manufacturing a thin-film transistor according to claim 1, further comprising forming an interlaminer insulating layer to cover the gate region, and thereafter forming corresponding electrodes so as to provide electrical interconnection with the source region, the drain region and the gate region.

8. A process of manufacturing a thin-film transistor, comprising steps of:
   (1) forming an amorphous silicon layer at the upper part of an unannealed glass substrate;
   (2) irradiating the amorphous silicon layer by laser light to form a polycrystalline silicon layer;
   (3) implanting an element belonging to Group IIIb or an element belonging to Group Vb, into the polycrystalline silicon layer;
   (4) forming an insulating layer on the polycrystalline silicon layer at a temperature of 500° C. or below;
   (5) forming a gate region on the insulating layer;
   (6) implanting an element belonging to Group Vb or an element belonging to Group IIIb, into a source region and a drain region by ion implantation, using the gate region as a mask.

9. The process of manufacturing a thin-film transistor according to claim 8, wherein the step of forming said insulating layer comprises oxidizing the surface of said polycrystalline silicon layer in an atmosphere containing at least ozone.

10. The process of manufacturing a thin-film transistor according to claim 8, wherein said element belonging to Group IIIb is boron and said element belonging to Group Vb is phosphorus.

11. The process of manufacturing a thin-film transistor according to claim 8, wherein in step (3) an element from Group IIIb is implanted and in step (7) an element from Group Vb is implanted.

12. The process of manufacturing a thin-film transistor according to claim 8, wherein in step (3) an element from Group Vb is implanted and in step (7) an element from Group IIIb is implanted.

13. The process of manufacturing a thin-film transistor according to claim 8, wherein the step of forming the insulating layer comprises oxidizing the surface of said polycrystalline silicon layer in an atmosphere containing at least ozone to form a first insulating layer, and depositing a second insulating layer on the first insulating layer.

14. The process of manufacturing a thin-film transistor according to claim 8, further comprising forming an interlaminer insulating layer to cover the gate region, and thereafter forming corresponding electrodes so as to provide electrical interconnection with the source region, the drain region and the gate region.

15. A process of manufacturing a thin-film transistor, comprising steps of:
(1) providing a polycrystalline silicon layer at the upper part of an unannealed glass substrate, the polycrystalline silicon layer being doped with an element belonging to Group IIIb or an element belonging to Group Vb;
(2) forming an insulating layer on the polycrystalline silicon layer at a temperature of 500° C. or below;
(3) forming a gate region on the insulating layer; and
(4) implanting an element belonging to Group Vb or an element belonging to Group IIIb, into a source region and a drain region by ion implantation, using the gate region as a mask.

16. The process of manufacturing a thin-film transistor according to claim 15, wherein the step of forming said insulating layer comprises oxidizing the surface of said polycrystalline silicon layer in an atmosphere containing at least ozone.

17. The process of manufacturing a thin-film transistor according to claim 15, wherein said element belonging to Group IIIb is boron and said element belonging to Group Vb is phosphorus.

18. The process of manufacturing a thin-film transistor according to claim 15, wherein the polycrystalline silicon layer is doped with an element belonging to Group IIIb and in step (5) an element from Group Vb is implanted.

19. The process of manufacturing a thin-film transistor according to claim 15, wherein the polycrystalline silicon layer is doped with an element belonging to Group Vb and in step (5) an element from Group IIIb is implanted.

20. The process of manufacturing a thin-film transistor according to claim 15, wherein the step of forming the insulating layer comprises oxidizing the surface of said polycrystalline silicon layer in an atmosphere containing at least ozone to form a first insulating layer, and depositing a second insulating layer on the first insulating layer.

21. The process of manufacturing a thin-film transistor according to claim 15, further comprising forming an interlaminer insulating layer to cover the gate region, and thereafter forming corresponding electrodes so as to provide electrical interconnection with the source region, the drain region and the gate region.

22. A process of manufacturing a thin-film transistor, comprising steps of:
(1) forming an insulating layer on a surface of a polycrystalline silicon layer which has an element belonging to Group IIIb or an element belonging to Group Vb and is formed at an upper part of an unannealed glass substrate;
(2) forming a gate region on said insulating layer;
(3) implanting an element belonging to Group Vb or an element belonging to Group IIIb, into a source region and a drain region by ion implantation, using the gate region as a mask; and
(4) forming an interlaminar insulating layer to cover said gate region, thereafter forming corresponding electrodes so as to provide electrical interconnection with the source region, the drain region and the gate region.

23. The process of manufacturing a thin-film transistor according to claim 22, wherein the step of forming said insulating layer comprises oxidizing the surface of said polycrystalline silicon layer in an atmosphere containing at least ozone.

24. The process of manufacturing a thin-film transistor according to claim 22, wherein said element belonging to Group IIIb is boron and said element belonging to Group Vb is phosphorus.

25. The process of manufacturing a thin-film transistor according to claim 22, wherein the step of forming the insulating layer comprises oxidizing the surface of said polycrystalline silicon layer in an atmosphere containing at least ozone to form a first insulating layer, and depositing a second insulating layer on the first insulating layer.

26. The process of manufacturing a thin-film transistor according to claim 22, further comprising forming an intertaminer insulating layer to cover the gate region, and thereafter forming corresponding electrodes so as to provide electrical interconnection with the source region, the drain region and the gate region.

* * * * *